United States Patent [19]
Westphal et al.

[11] Patent Number: 5,959,454
[45] Date of Patent: Sep. 28, 1999

[54] MAGNET ARRANGEMENT FOR AN NMR TOMOGRAPHY SYSTEM, IN PARTICULAR FOR SKIN AND SURFACE EXAMINATIONS

[75] Inventors: Michael Westphal, Offenbach; Bertold Knüttel, Rheinstetten, both of Germany

[73] Assignee: Bruker Analytik GmbH, Rheinstetten, Germany

[21] Appl. No.: 08/856,759

[22] Filed: May 15, 1997

[30]     Foreign Application Priority Data

May 24, 1996  [DE]  Germany ............................ 196 20 926

[51] Int. Cl.⁶ ........................................................ G01V 3/00
[52] U.S. Cl. ............................................ 324/320; 324/319
[58] Field of Search .................................. 324/319, 320, 324/318, 309, 307; 335/299, 297, 296

[56]                 References Cited

U.S. PATENT DOCUMENTS

| | | | |
|---|---|---|---|
| 3,810,254 | 5/1974 | Utsumi et al. ............................ | 324/0.5 |
| 4,689,591 | 8/1987 | McDougall .............................. | 335/299 |
| 4,701,736 | 10/1987 | McDougall et al. ..................... | 335/299 |
| 4,721,914 | 1/1988 | Fukushima et al. ..................... | 324/320 |
| 5,117,188 | 5/1992 | Ohkawa .................................. | 324/318 |
| 5,570,073 | 10/1996 | Müller .................................... | 335/299 |
| 5,652,517 | 7/1997 | Maki et al. .............................. | 324/319 |
| 5,677,630 | 10/1997 | Laskaris et al. ......................... | 324/319 |

FOREIGN PATENT DOCUMENTS

| | | |
|---|---|---|
| 0187691 | 7/1986 | European Pat. Off. . |
| 3809173 | 9/1988 | Germany . |
| 4037894 | 6/1991 | Germany . |
| 4424580 | 1/1996 | Germany ............................... 335/299 |
| 4425997 | 1/1996 | Germany . |

OTHER PUBLICATIONS

Patents Abstracts of Japan, C–862, Aug. 27, 1991 vol. 15/No. 337 Sumitomo Special Metals Co. Ltd.: "Equipment for Generating . . . ".

*Primary Examiner*—Louis Arana
*Attorney, Agent, or Firm*—Paul Vincent

[57]                 ABSTRACT

Magnet arrangement for a one-sided NMR tomography system having a permanent magnetic ring (4) of an outer radius $R_a$ and an inner radius $R_i$ and being magnetized axially in the direction of the z-axis and extending in the axial direction up to a plane E ($z=z_E$) for generating a homogeneous magnetic field B in a measuring volume (2) is characterized in that, in a radial region $R<R_i$, at least one further permanent magnetic field-generating element, which is rotationally symmetric, is arranged with respect to the plane E on the same side as the permanent magnetic ring (4) at an axial distance from plane E, whereby a depression V is formed on the surface of the magnet arrangement (1) facing plane E and that the permanent magnetic field-generating elements generate at least 90%, preferably 99% of the homogeneous magnetic field B in the measuring volume (2). In this manner, NMR examinations of the skin or other regions which are close to the surface can be carried out in a particularly easy manner.

28 Claims, 8 Drawing Sheets

MAGNET ARRANGEMENT FOR AN NMR TOMOGRAPHY SYSTEM, IN PARTICULAR FOR SKIN AND SURFACE EXAMINATIONS

The invention relates to a magnet arrangement for a one-sided NMR tomography system which is rotationally symmetric about a z-axis, comprising a permanent magnetic ring with an outer radius $R_a$ and an inner radius $R_i$ which is magnetized axially along the z-axis and extends in the axial direction up to a plane E ($z=z_E$), for the generation of a homogeneous magnetic field B in a measuring volume.

A magnet arrangement of this type is known from U.S. Pat. No. 5,117,188.

The known arrangement comprises horizontal circular ring-shaped means for the generation of a magnetic field, which are usually in the form of a coil which, however, may also use permanent magnets. A disc-shaped insert made from ferromagnetic material, preferentially iron, the surface of which is to be formed such that a homogeneous magnetic field prevails in a spherical imaging volume above the circular surface, is provided radially within and axially below said ring-shaped area. The radius of the preferred arrangement corresponds approximately to the length of a human body and the imaging volume has a diameter of 30 cm. Although arrangements for imaging magnetic resonance generally require a gradient system with sets of gradient coils which, in the switched state, can be loaded with a current, such sets are not explicitly mentioned in the above-cited U.S. patent.

Tomography systems for carrying out diagnostic examinations of a human body on the basis of nuclear magnetic resonance (NMR) are known in the art. As components for the generation of a magnetic field, they require a main field magnet as well as a gradient coil system consisting of three gradient coils. The object of the main field magnet consists in generating a magnetic field, which is sufficiently strong and sufficiently constant with respect to time and space, in a volume which is big enough for the NMR examination. Currently, low temperature superconducting magnet systems having field strengths between 0.5 T and 4 T, resistive magnet systems having a field strength between 0.1 T and 0.4 T as well as permanent magnet systems having a field strength between 0.06 T and 0.3 T are used as main field magnets. In the case of NMR examinations, only a spatial region can be used as measuring volume in which the magnetic field strength is largely constant, i.e. the relative variation of the field strength is less than approximately 50 ppm. In the case of so-called whole body magnets, by means of which an entire human body can be examined, this region is, in general, approximately spherical having a diameter of between 30 cm and 50 cm.

A "one-sided" NMR tomography system means a system in which access to the measuring volume is possible via a polar angle of almost 180° and an azimuthal angle of 360°.

Superconducting whole body magnets, which usually have a solenoid-shaped magnet coil, comprise a tube-shaped opening for the patient with a diameter of approximately 90 cm and a length of between 1.4 m and 2.5 m, wherein the measuring volume is located in the center of the tube. The tube-shaped gradient coil system is located also in the opening in the magnet provided for the patient and encloses the latter.

Resistive magnet systems often have a similar construction and comprise a tube-shaped gradient coil system and a tube-shaped opening for the patient which enclose the latter. Other forms of resistive systems include pole shoe magnets in which the patient lies between the pole shoes of an electromagnet. In the case of whole body magnets the distance between the pole shoes is approximately 50 cm to 60 cm. The gradient coil system consists of two disc-shaped partial systems which are mounted on the pole shoes of the magnet and further reduce the size of the opening for the patient. The iron pole shoes are always located at the ends of a return yoke of iron. This yoke may be C-shaped or e.g. may consist of two square or rectangular iron plates which are connected to each other by means of four iron columns which are mounted at the corners. The two main field coils each normally enclose a cylindrical iron core which connects a pole shoe with the neighboring iron plate of the return yoke.

Permanent magnet systems are usually pole shoe magnets which differ from resistive pole shoe magnets mainly only in that the cylindrical iron cores surrounded by the magnet coils each are replaced by a cylindrical block of permanent magnetic material.

Irrespective of the type of the whole body system, conventional whole body systems have the disadvantage that they usually enclose a human body and also the gradient coil system in a particular manner and are thus relatively large and, due to the material costs, accordingly expensive. Further costs arise from the need for space which has to be correspondingly large, from shielding means for the magnetic stray field and for the rf field which is also required for tomography systems, from additional components such as patients' beds as well as from high power supply units and from the energy consumption for operating the large-volume gradient coil systems.

The operation of superconducting and resistive main field magnets is, furthermore, associated with considerable energy costs, in the case of superconducting systems due to the operation of refrigerators or the re-liquefying of cooling means, in the case of resistive systems due to the electrical power losses in the coils.

With respect to numerous classes of application in which not every region of a human body has to be covered by means of MR tomography methods, the development of dedicated small tomography systems is considered and partially carried out with a measuring volume reduced in size, which do not have the disadvantage of high costs for the system and its operation. An example thereof is the use of relatively small resistive pole shoe magnets for orthopedic examinations of ankles, knee joints, wrists and elbow joints.

The diagnosis of visible changes of human skin is a further important class of applications, however, a dedicated NMR tomography system suitable in this case does not yet exist. In contrast to the situation regarding whole body tomographs, in this case the size of the measuring volume with field variations of approximately 20 ppm, can be limited to values in the range of 1 . . . 2 cm³ or even less. But it should still be possible for the main field magnet or the gradient coil system to cover the whole area of the skin without any hindrance. Generation of the field should, if possible, be performed by using permanent magnetic material in order to avoid high operational costs. The magnetic field strength should not be less than in the case of corresponding whole body tomographs, e.g. if possible more than 0.1 T. The dimensions of the magnet system in the case of measuring volumes of 1 . . . 2 cm³ should be considerably less than in a whole body magnet, i.e. less than 0.5 m in all directions. Furthermore, the shape of the main field magnet should be such that it becomes possible to mount a gradient coil system which meets essentially three requirements:

it must be possible to generate in the measuring volume region of the magnet three field gradients orthogonal with respect to each other and having sufficient linearity and strength;

the gradient coils should generate no stray field in the area of the main field magnet in order to reduce eddy currents in the material of the main field magnet;

as mentioned above, the gradient coil system should not obstruct access to the measuring volume for the patient or the area of the skin to be examined due to its mechanical arrangement.

Suitable gradient coils exhibiting these properties are novel and are described in a parallel German patent application.

Versions of the above-described conventional whole body tomographs, which are reduced in size, do not meet these requirements, in particular since it is no longer possible to introduce all areas of the skin, i.e. the surface of a patient, into the measuring volume. Such an example is known from DE 38 09 173 A1. This document proposes a coil arrangement for generating the main field, which is approximately solenoid-shaped and has small dimensions. This arrangement enables examinations of the skin of a patient only in those areas which can be inserted into the magnet coil, i.e. in the area of a hand and lower arm. Obvious possibilities to solve this problem by means of horseshoe magnets or by means of magnet systems, in the stray field of which NMR experiments could be carried out, are not successful due to the inhomogeneity of the field.

It is therefore an object of the present invention to present magnet arrangements of the initially mentioned kind, by means of which NMR examinations of the skin or other regions near the surface can be carried out and which meet the above-mentioned requirements and/or comprise the corresponding advantages.

This object is achieved according to the invention in that, in a radial area $R<R_i$ at least one further permanent magnetic field generating element, which is rotationally symmetric, is arranged with respect to the plane E on the same side as the permanent magnetic ring at an axial distance from the plane E, whereby a depression V is formed on the surface of the magnet arrangement facing the plane E and in that the permanent magnetic field generating elements generate at least 90%, preferentially 99% of the homogeneous magnetic field B in the measuring volume.

In this manner, a measuring volume suitable for NMR measurements and with almost negligible variation of the magnetic field $B_z$ along the z-direction can be generated by suitable selection of the detailed geometric dimensions of the depression V in the area of the intersection point of the plane E and the z-axis.

In a preferred embodiment of the invention, the radially outer surface of the arrangement is cylindrical with a cylinder radius $R_a$ and extends axially to the plane E. The radially outer part of the arrangement then inevitably exhibits a planar surface on plane E. In this manner, manufacturing of the arrangement can be simplified.

In a furthermore preferred embodiment of the invention the shape of depression V is largely cylindrical with a cylinder axis z, an essentially planar bottom and a cylindrical outer limitation with a cylinder radius $R_i$ and an axial length T. This shape, simplified in this manner, enables a facilitated and cheap production of the arrangement.

In a still further preferred embodiment of the invention, structures which are rotationally symmetric are provided in a largely planar bottom of the depression V. In this manner, it is possible to generate a particularly large measuring volume having a homogeneous magnetic field.

In an alternative or furthermore preferred embodiment of the invention structures which are rotationally symmetric are provided in the rear side of the magnet arrangement facing away from plane E. In this manner, it is possible to generate a particularly large measuring volume having a homogeneous magnetic field.

In a particularly preferred embodiment of the invention, the magnet arrangement comprises several stacked permanent magnetic cylinder rings and are mechanically connected tightly to each other as well as, if necessary, a solid permanent magnetic cylinder on the z-axis. The mechanical connection may be effected e.g. by grouting with synthetic resin. It is then possible to generate a particularly large measuring volume having a homogeneous magnetic field by adequate selection of the inner and outer radii and the axial lengths of the cylinders. At the same time, the arrangement exists merely of components the production of which is relatively easy and precise.

In a preferred further development of the invention, the ratio of the cylinder radii $R_a/R_i$ is between 1.2 and 4.0. With predetermined size of the measuring volume, particularly compact magnet arrangements can be realized in this manner.

In a preferred further development of the invention, the ratio $T/R_i$ of axial length T to radius $R_i$ of depression V is in a range between 0.2 and 0.8. With predetermined size of the measuring volume, particularly compact magnet arrangements can be realized in this manner and furthermore, the depression offers sufficient space for a gradient coil system which extends in the axial direction, is actively shielded from the magnet and does not generate a stray field in the region of the magnet arrangement.

In a further advantageous embodiment of the inventive magnet arrangement, the outer radius is $R_a \leq 0.4$ m. Magnet arrangement of this type is particularly handy and easy to manipulate. Embodiments having $R_a < 0.1$ m are particularly suitable for applications in the field of dermatology, wherein the production of the arrangement consumes particularly little material.

In a further preferred embodiment, the magnetic field strength generated by the magnet arrangement is between 0.05 T and 0.3 T. Thus, is it easily possible to use available, commercial permanent magnetic materials for the production of the magnet arrangement.

In a preferred embodiment of the invention, the measuring volume is located in the axial direction completely or partially on the side of plane E facing away from the magnet arrangement. In this manner, it is possible to achieve a particularly good access for the patient to the measuring volume.

An embodiment of the magnet arrangement according to the invention is particularly advantageous, in which a magnetic mirror plate of soft-magnetic material is provided on that side of the magnet arrangement facing away from plane E. In this manner, the apparatus becomes particularly compact on the one hand and on the other hand it is possible to save up to 50% of expensive permanent magnetic material in the production of the arrangement which can generate the same magnetic field strength.

In a preferred embodiment of the invention one or more disc-shaped removable supporting plates are mounted on the rear side or at the bottom of the depression V, on which small additional magnets may be mounted. This enables the correction of deviations from a homogeneous field-strength distribution which are detected by measuring the magnetic field in the region of the measuring volume and are caused e.g. by manufacturing tolerances. The additional magnets may be magnetized in the same direction as the main field magnet or in a direction opposite thereto.

In a preferred embodiment of the invention, the field generating elements contain a permanent magnetic material with high magnetic hardness whose magnetization M(H) in the magnetized state is reduced by less than 20% with respect to the remanent magnetism $M_r$ upon application of a magnetic demagnetizing field H up to a strength at which the magnetic induction B in the magnetic material disappears. In this manner, the magnet arrangement is prevented from demagnetization at any location in the magnetic material in its own magnetic field.

Permanent magnetic materials having a remanent magnetization of $M_r$ of more than 1.0 T, made e.g. from SmCo compounds or from NdFeB alloys are particularly preferred. NdFeB alloys are especially preferred. In this manner, particularly high magnetic field strengths can be generated in the measuring volume.

An embodiment of the invention is particularly preferred, in which a regulation means is provided for regulating the surrounding temperature of the magnet arrangement. In this manner, it is possible to minimize temporal variations of the magnetic field in the measuring volume caused by reversible changes of the magnetization due to the temporal variations of the temperature which are to be expected, to a certain extent, with all magnetic materials.

Furthermore, one embodiment is preferred to further improve the stabilization of the temperature of the magnetic material, in which the surface of the magnet arrangement is surrounded completely or at least partially by a first layer of sheet metal having a good thermal conductivity and—at a short distance therefrom—with a second layer which consists completely or partially of metal, wherein the second layer is connected to the first layer by means of spacers having a poor thermal conductivity, and the temperature of the second layer is regulated or stabilized. The material of the first layer having a good thermal conductivity is preferentially copper or aluminum. The second layer is preferentially also made of a good thermally conducting material. In this manner, temperature gradients on the surface of the magnet arrangement remain at a minimum due to the first layer and furthermore, remaining temperature variations of the temperature-stabilized second layer are transmitted to the magnet arrangement only to a minimum degree. The surface of the second layer forms in the vicinity of the plane E a depression V' which resembles depression V. In this manner, the entire arrangement can be configured such that the patient access to the measuring volume is hardly impaired.

This temperature-stabilized arrangement can be further improved by introducing a super-insulating material known from cryo technology, into the space between the first layer and the second layer and evacuating the space. In this manner, the protection of the magnet arrangement from temperature variations due to remaining temperature variations in the second layer is further improved.

In a particularly preferred embodiment of the magnet arrangement according to the invention, a gradient coil system, which is also limited to a half space confined by the plane E, is located in the depression. Depression V generally offers room for a gradient coil system consisting of three partial coils, wherein the geometrical extension of the windings of the three gradient coils can be configured such that, by means of these coils, gradient fields $G_z=dB_z/dz$, $G_x=dB_z/dx$, $G_y=dB_z/dy$ can be set in the measuring volume, wherein x and y are two co-ordinate axes which originate from the center of the measuring volume and are perpendicular with respect to one another and to the z-axis.

In a particularly advantageous further development of this embodiment, an essentially planar surface rf coil can be arranged on the surface of the gradient coil system, which coil generates a magnetic rf field in the region of the measuring volume the direction of which is perpendicular to the z-direction. The main field magnet constitutes, in combination with the gradient coil system, a complete system which exhibits on the side contacting the plane E, an essentially planar surface which may still exhibit a slight depression in the region of depression V. The entire measuring volume is located in front of this surface and is accessible for almost all skin regions of a human body.

It is preferred to use the magnet arrangement in an MR tomograph with a gradient coil system consisting of three partial coils for the generation of three field gradients $dB_z/dz$, $dB_z/dx$, $dB_z/dy$, which can be set by selection of the currents in the partial coils, in the axial direction z and/or in two directions x and y, which are orthogonal thereto and with respect to one another, within the measuring volume, wherein the gradient coil system is located completely on that side of the measuring volume facing the magnet arrangement. This is rendered possible in principle by the provision of depression V and/or depression V' in the surface of the magnet arrangement and/or their thermal shielding. In this manner, unobstructed patient access to the measuring volume for skin examinations is maintained.

Moreover, a further development of this arrangement is advantageous in which all partial coils contain active shielding coils which largely reduce the stray field of each partial coil in the area of the magnetic material of the arrangement. In this manner, it is possible on the one hand to quickly switch the currents in the gradient coils on and off without causing undesired time-dependent interference fields to superimpose on the gradient fields due to eddy currents induced in the magnetic material or the sheet metals and the thermal shielding, and on the other hand, in this manner the eddy currents do not generate any heat in the magnetic material and thus thermal stability is not impaired.

In an improved further development it is provided that the windings of each shielding coil are each located in a plane, which is perpendicular to the z-axis. In this manner, production of the shielding coils is facilitated to a great extent.

A further development is especially preferred, in which these planes are arranged as closely as possible to the bottom of depression V of the magnet arrangement and/or of depression V' of the thermal shielding. In this manner, a particularly good shielding effect of the gradient coils can be achieved on the one hand and on the other hand, with predetermined gradient strength in relation to the coil current, minimum inductance can be achieved, which is desired for the switching behavior.

In an alternative further development, the windings or winding sections of each shielding coil are each located partly in a plane perpendicular to the z-axis and partly on the surface of a cylinder delimiting said plane radially at the outside, wherein these planes are arranged preferentially as close as possible to the bottom of depression V of the magnet arrangement and/or depression V' of the thermal shielding, and the cylinder surface is arranged as close as possible to the surface of the cylindrical delimitation of depression V or depression V'. In this manner, an even better shielding effect of the gradient coil field towards the main field magnet is achieved.

A further development is also advantageous, in which the windings of each partial coil, which are not located in the shielding coils, are each located in one plane. In this manner, the production of the partial coils becomes particularly simple.

Additionally preferred is a further development, in which said plane has as small a distance as possible from the measuring volume and/or the region which is required for unobstructed patient examination. In this manner, a particularly good shielding effect as well as minimization of the inductance can be achieved.

As an alternative, a further development is preferred, in which the windings of the partial coils which are not located in the shielding coils are arranged in an area which comprises, in the area of relatively small radial distances from the z-axis, a depression V" to the magnet arrangement. In this manner, it becomes possible also to examine the skin in the region of parts of a human body which are more difficult to access (noses, ears).

Within the scope of the invention there is also a gradient coil system for a one-sided NMR tomography system having a magnet arrangement which is constructed preferentially in the above-mentioned manner. The gradient coil system according to the invention is characterized in that there are provided three partial coils for the generation of three magnetic field gradients $dB_z/dz$, $dB_z/dx$, $dB_z/dy$ along the z-axis of the magnet arrangement and/or in two spatial directions x and y, orthogonal thereto, within the measuring volume of the tomography system, which magnetic field gradients can be set by selection of the partial coil currents, and also three shielding coils which are each associated to one of the partial coils and that the windings of the partial coils and the shielding coils are located on cone-shaped surfaces having cone opening angles of between 150° and 180°. A gradient coil system of this type is particularly suitable to be used with the above-described magnet arrangement according to the invention.

Methods for the production of the main field magnet are preferred, in which the magnet arrangement is assembled completely from prefabricated non-magnetized partial bodies, for example by gluing, and is magnetized only afterwards. The magnetization may be effected in a pulse field magnet or in a superconducting magnet. This method is rendered possible in that the magnet arrangement having an axial length of e.g. 20 cm and an outer radius $R_a$ of approximately 25 cm is relatively compact, fits completely into such magnetization magnets and furthermore does not contain any parts of soft iron, like e.g. yokes, which would considerably distort the magnetizing field. This method has the advantage that magnetic forces do not occur during the production such that particularly easy and precise production becomes possible.

Furthermore, production methods are preferred, in which the prefabricated non-magnetized partial bodies are cylindrical rings or solid cylinders. These are adjusted to the required rotational symmetry to an optimum degree and allow particularly precise production.

Further advantages of the invention can be derived from the description and the accompanying drawing. The abovementioned features according to the invention as well as those to be described below can be utilized individually or collectively in arbitrary combination. The embodiments shown and described are not to be considered as an exhaustive enumeration, rather have exemplary character.

The invention is shown in the drawing and is described and explained in more detail with respect to concrete embodiments. In the drawing.

Figure 1:
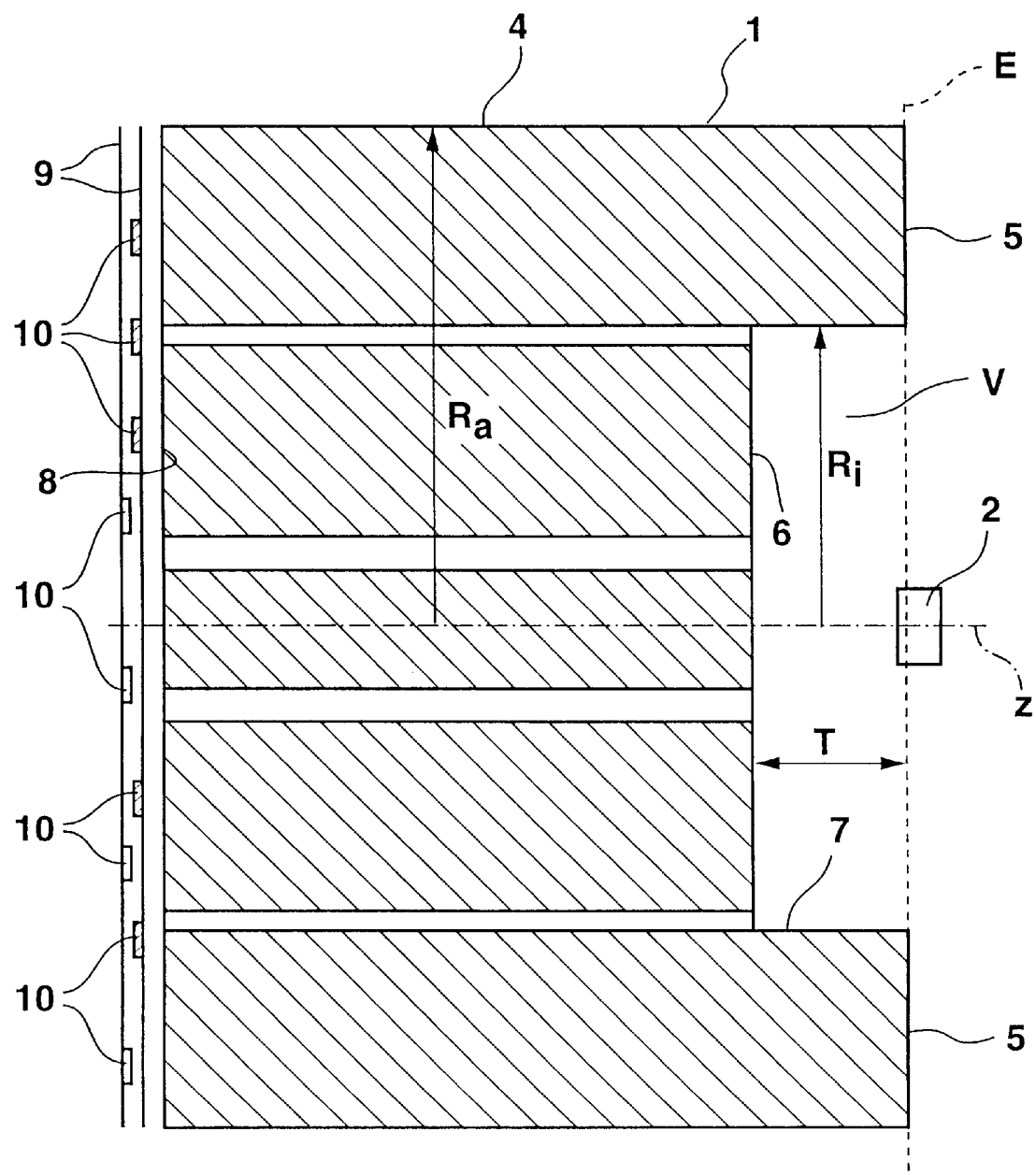
FIG. 1 shows a schematic cross-section through an embodiment of a magnet arrangement which is rotationally symmetric according to the invention.

FIG. 1 shows in detail a cross-section, containing the rotational axis z, through a magnet arrangement 1 in accordance with the invention which is rotationally symmetric. In this case, the magnet arrangement 1 consists of an outer cylindrical ring 4 having an outer radius $R_a$ and an inner radius $R_i$ and an inner cylindrical ring provided in its bore 7 and again a solid cylinder provided for in the bore of the cylindrical ring. One axial end 5 (the right-hand one in the figure) of the outer cylinder 4 defines a plane E. The corresponding (right-hand) axial ends of the inner cylindrical ring and of the solid cylinder are spaced away from plane E. In this manner, a cylindrical depression V having an axial extension T and an outer radius $R_i$ is created.

Exemplary dimensions are outer and inner radii of $R_a$=13.4 cm and $R_i$=8.04 cm, respectively, and an axial length of 17.6 cm for the outer cylindrical ring 4, radii of 7.37 cm and 2.43 cm, respectively, and an axial length of 14 cm for the inner cylindrical ring and a radius of 1.51 cm and a length of 14 cm for the solid cylinder. The axial length T of depression V is T=3.7 cm.

In the case of ideal hard magnetic permanent magnetic material having magnetization independent of the field strength, an almost cylindrical measuring volume 2 is created having variations in magnetic field strength of less than 20 ppm (parts per million) and an axial extension of 1 cm and a diameter of 1.6 cm. In the case of magnetization of the magnetic material of 1.3 T, the inductance $B_0$ in the measuring volume is 0.184 T. The center of measuring volume V is spaced 4 cm away from the bottom 6 of depression V.

On the rear side 8 of magnet arrangement 1, removable supporting plates 9 are mounted on which magnetized elements 10 of permanent magnetic material are fastened by means of which it is possible to compensate for inhomogeneities of the magnetic field in the measuring volume 2, e.g. due to mechanical tolerances of the arrangement.

Figure 2:
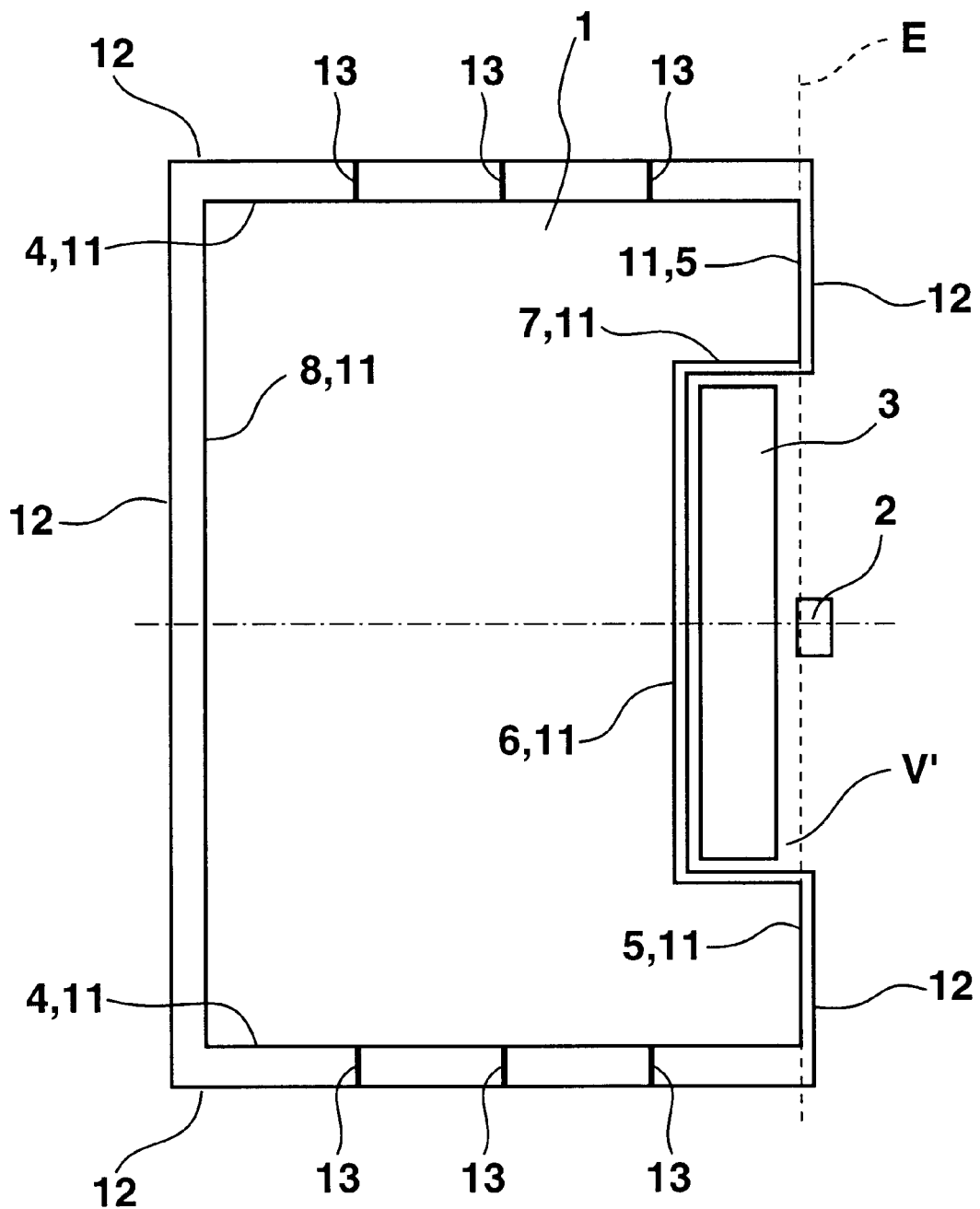
FIG. 2 shows a schematic cross-section through an embodiment of a magnet arrangement which is rotationally symmetric according to the invention having a thermal vacuum insulation layer.

FIG. 2 also shows a highly schematized cross-section through magnet arrangement 1. In this figure, according to a preferred embodiment, the entire surface of magnet arrangement 1 is directly surrounded by a thermally conducting metallic first layer 11. Furthermore, the arrangement is surrounded by a second metallic layer 12 with regulatable temperature. The second layer 12 of sheet metal is connected to magnet arrangement 1 by spacers 13 having poor thermal conductivity. The volume between magnet arrangement 1 and second layer 12 is preferably evacuated. Second layer 12 comprises a depression V' on the side facing measuring volume 2. A gradient coil system 3 for the generation of three magnetic field gradients within the measuring volume 2, which can be set by selection of the partial coil currents of the gradient coil system 3, is located in depression V'.

Figure 3:
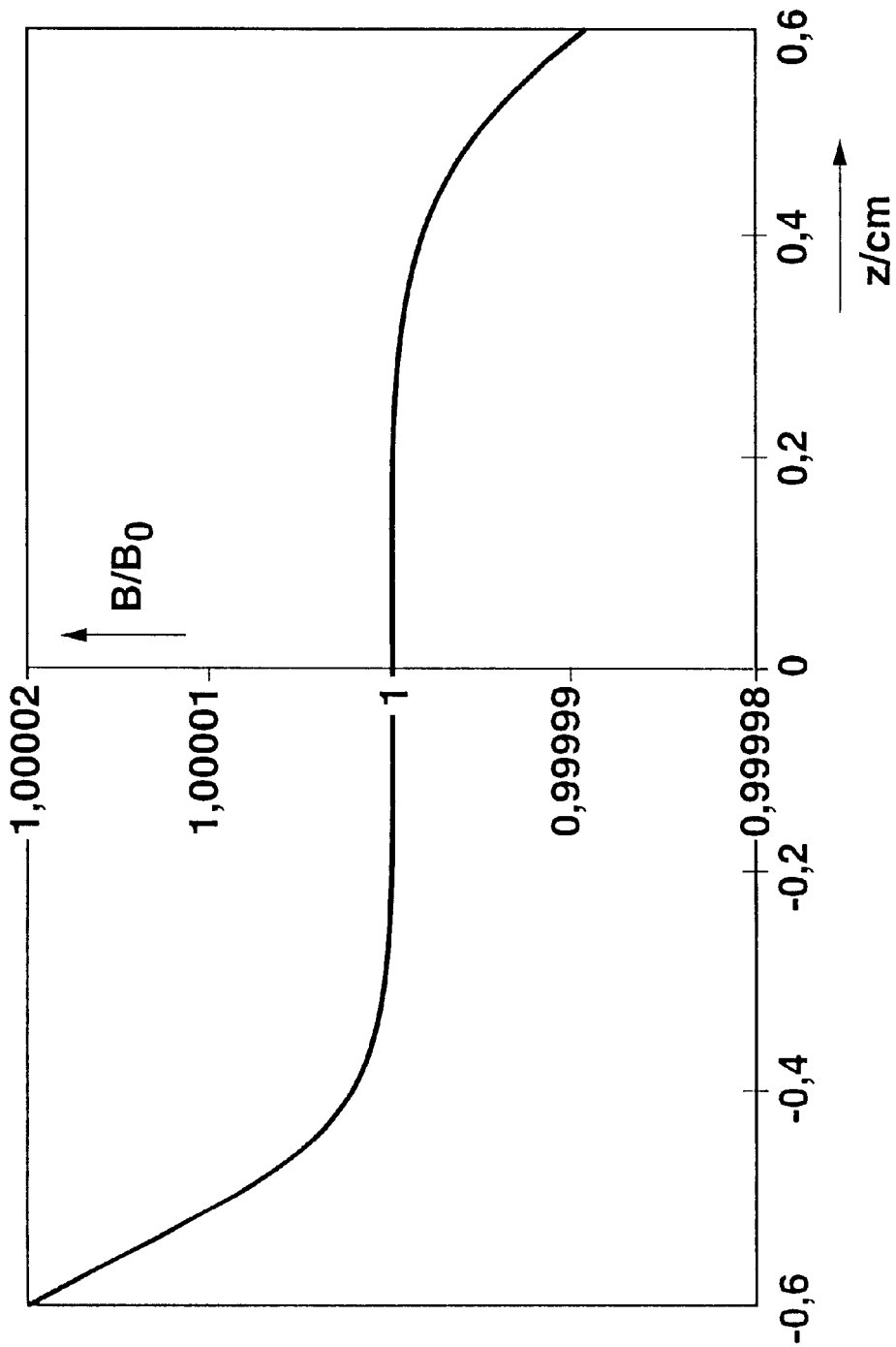
FIG. 3 shows the dependence of the magnetic inductance B along the z-axis of the embodiment according to FIG. 1.

FIG. 3 shows the dependence of the magnetic inductance B along the z-axis in the region of the measuring volume 2 with respect to the magnet arrangement 1 of FIG. 1. The co-ordinate z=0 is located at a distance of 4.0 cm from the bottom of depression V.

Figure 4:
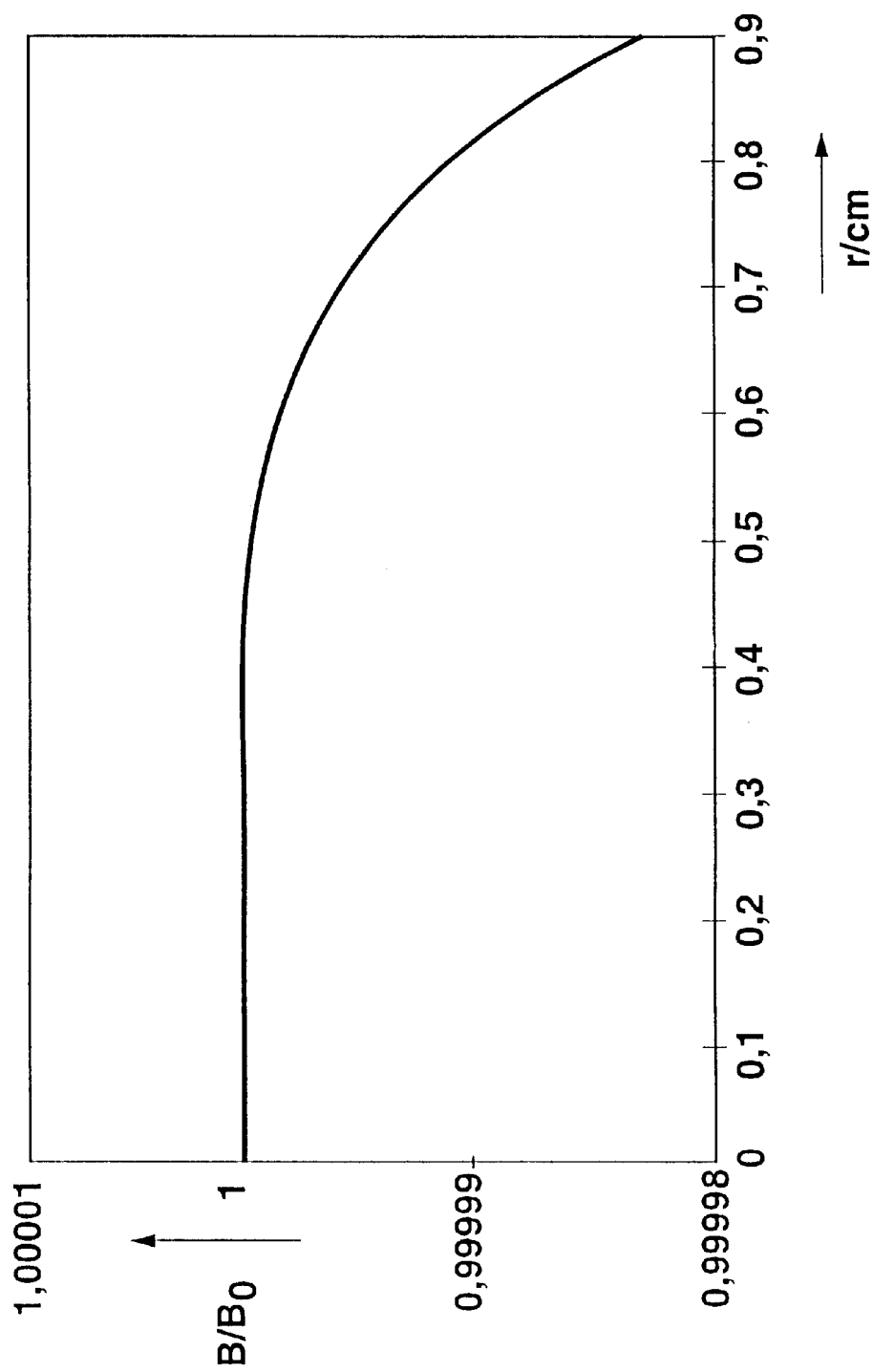
FIG. 4 shows the dependence of the magnetic inductance B in the plane z=0 as a function of the radial distance r from the z-axis in the embodiment according to FIG. 1.

FIG. 4 shows the dependence of the magnetic inductance B in the plane z=0 as a function of the radial distance r from the z-axis with respect to the magnet arrangement 1 of FIG. 1.

Figure 5:
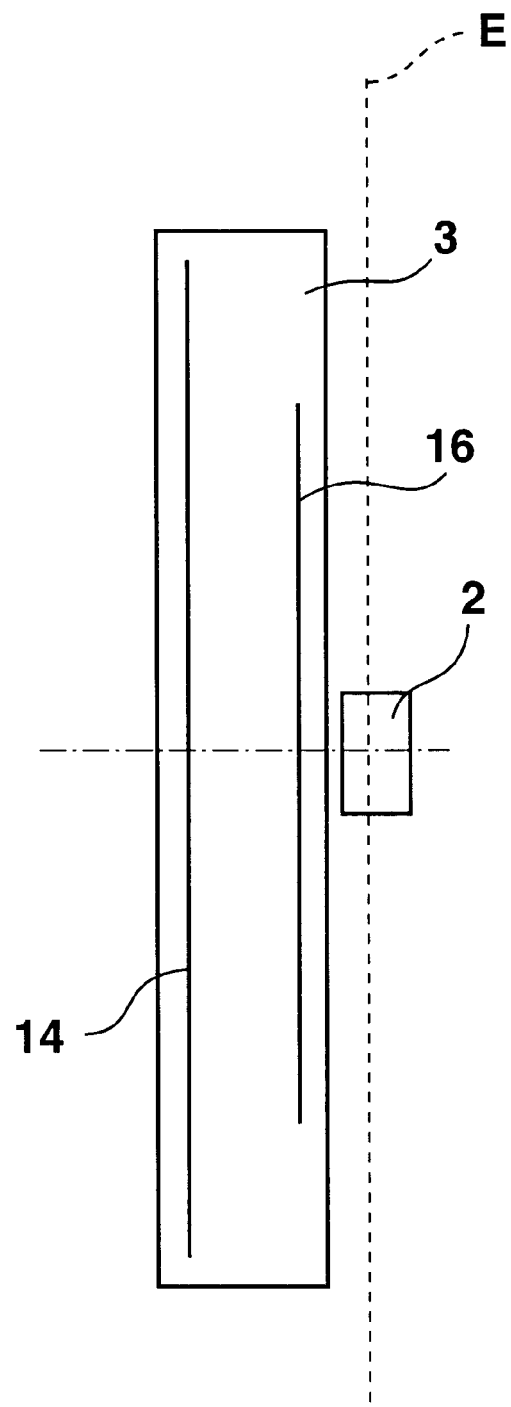
FIG. 5 shows a schematic sectional view of a gradient system suitable for the magnet arrangement according to FIG. 1.

FIG. 5 shows a highly schematized sectional view of a gradient coil system 3 suitable for the magnet arrangement 1 shown in FIG. 1. It has an axial extension of 2.6 cm and a radius of 7.3 cm. Its rear side is located at a distance of 0.6 cm from the bottom 6 of depression V. Its front side has a distance of 3.2 cm from the bottom 6 of depression and/or of 0.8 cm from the center z=0 of measuring volume 2. The figure shows furthermore two planes 16 and 14, respectively, in which the windings of a gradient coil and of a shielding coil, respectively, are guided. These planes exhibit distances of 1.2 cm and 3 cm, respectively, from the center z=0 of measuring volume 2.

Figure 6:
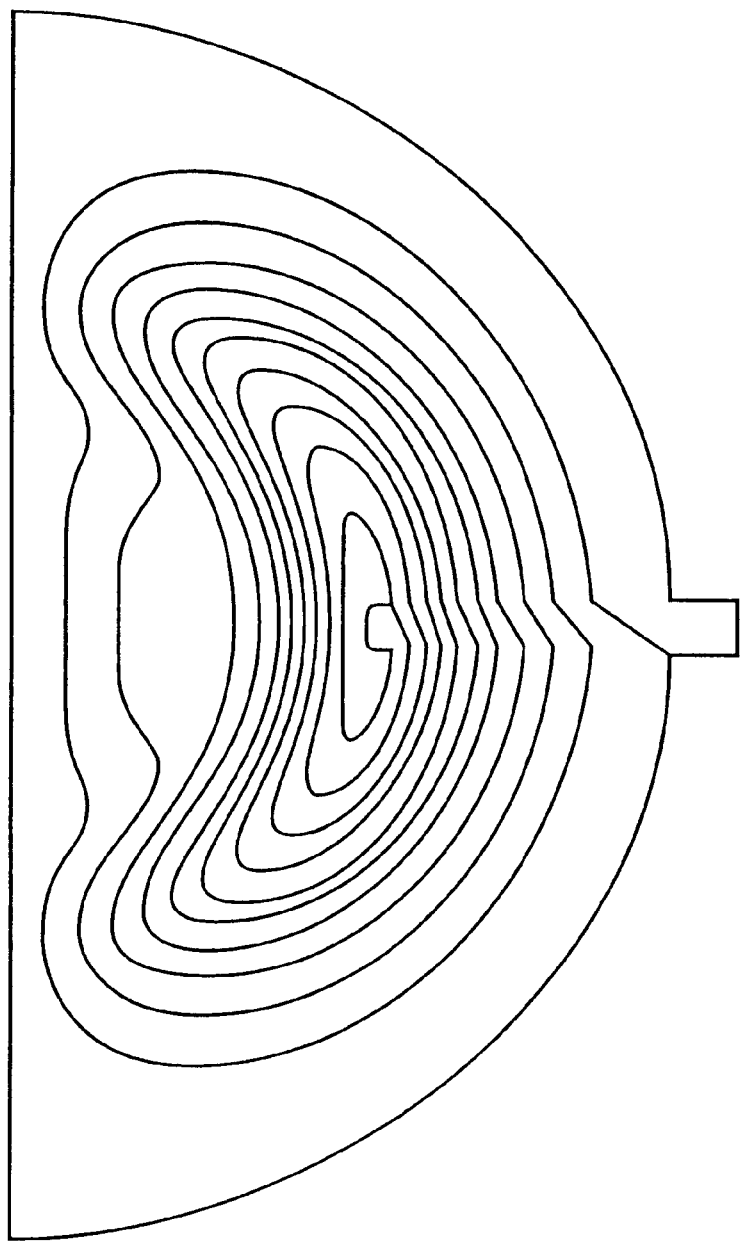
FIG. 6 shows the dependence of the windings of half a transverse gradient coil ($G_x$) according to the invention.

By means of the gradient coil system 3 of FIG. 5, FIG. 6 shows the dependence of the windings of half a transverse gradient coil, e.g. an x-gradient coil which generates in the measuring volume 2 a gradient field $dB_z/dx$ having a high linearity. The ten windings shown are distributed in a semi-circular area having a radius of 5 cm. The windings of the other half supplement the semi-circle to form a solid circle and extend in a mirror-inverted manner. With a current of 10 A the gradient strength would be 25 mT/m. The inductance is 5.2 microHenry. The shown winding pattern may be generated e.g. by etching of a copper-plated foil or by cutting or water-jet cutting of a copper plate.

Figure 7:
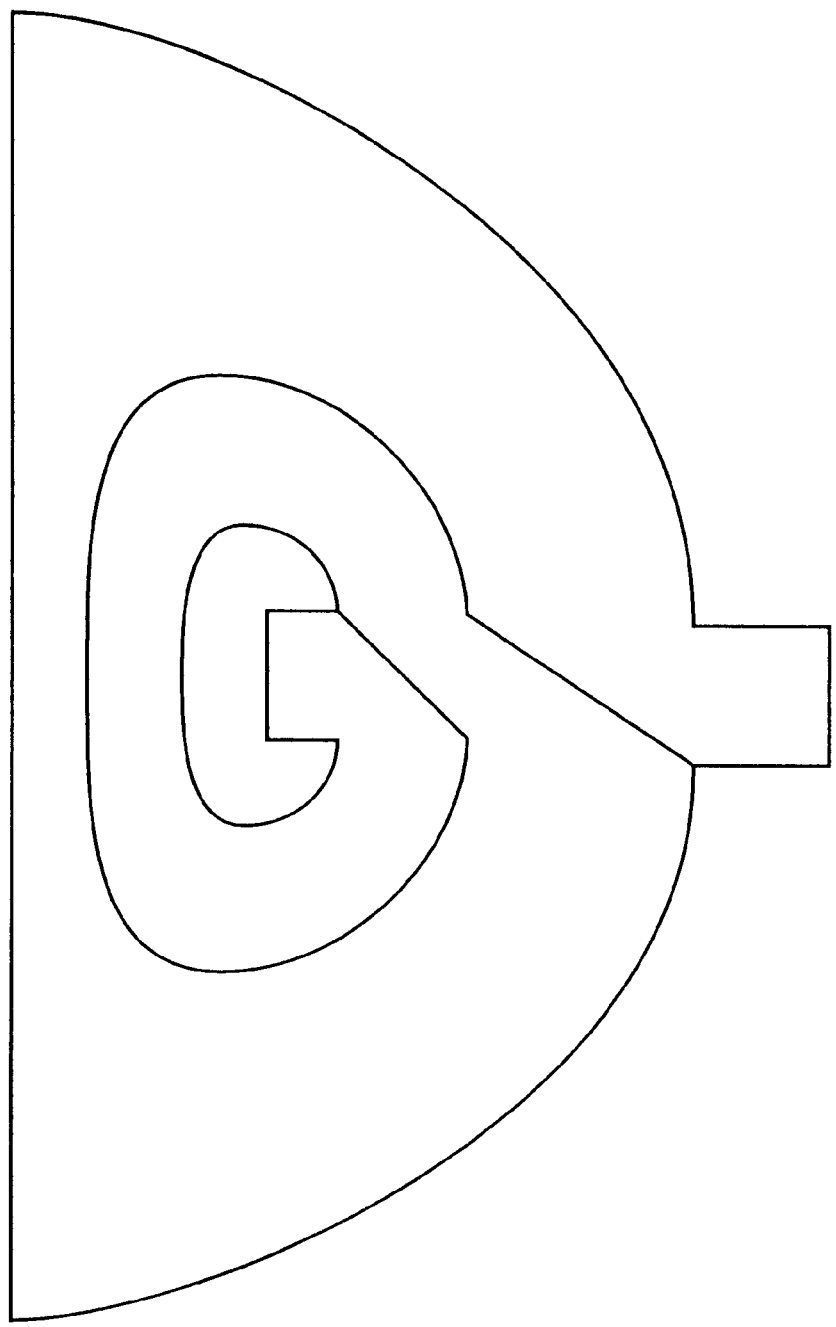
FIG. 7 shows the winding pattern of half a shielding coil which belongs to FIGS. 5 and 6.
Figure 8:
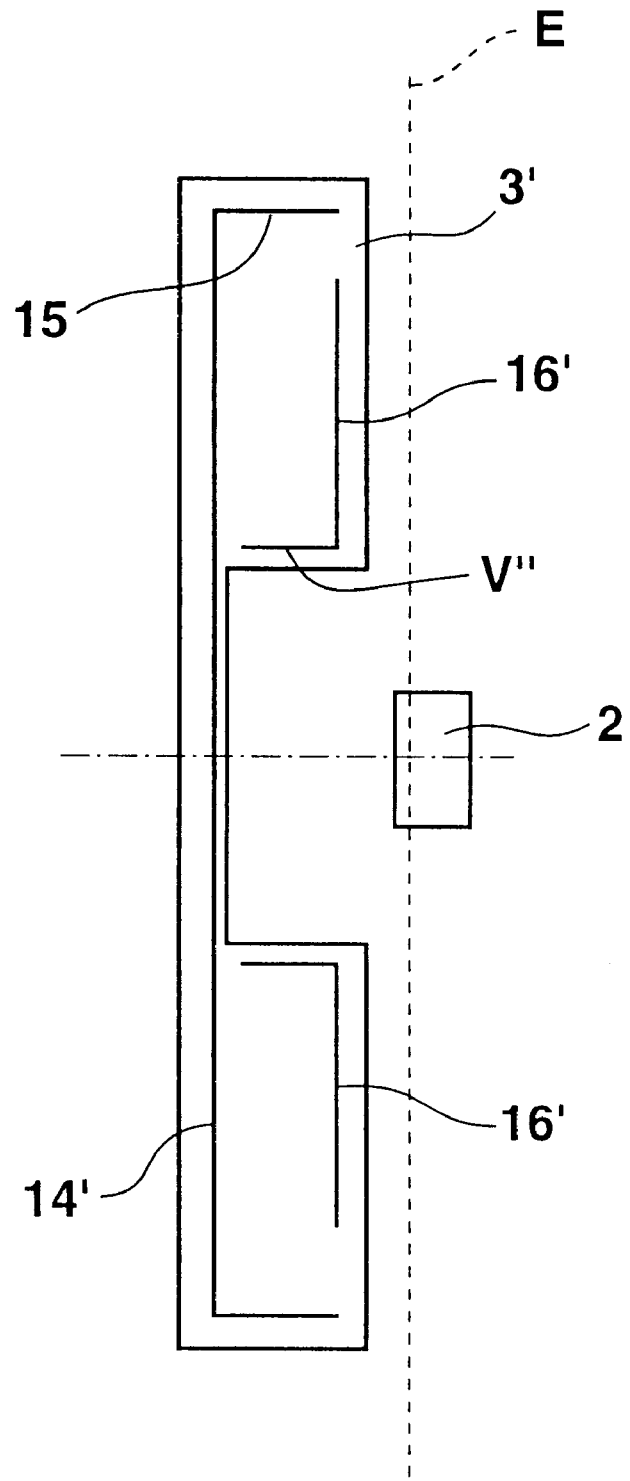
FIG. 8 shows a schematic sectional view of an alternative embodiment of the gradient coil system according to the invention.

By means of the gradient coil system 3 from FIGS. 5 and 6, FIG. 7 shows the winding pattern of one half of the associated shielding coil with two windings Finally, FIG. 8 shows a highly schematized sectional view of a gradient coil system 3' constructed in an alternative manner.

Herein, the windings of the shielding coil are distributed on a support body comprising a planar part 14' and a cylindrical part 15. The windings of the gradient coil 16' are distributed on a support body which permits a depression V" to be formed.

We claim:

1. Magnet arrangement for a one-sided NMR tomography system which is rotationally symmetric about a z-axis, comprising a first permanent magnet ring with an outer radius $R_a$ and an inner radius $R_i$ magnetized axially along the z-axis and extending in the axial direction up to a plane E ($z=z_E$), for the generation of a homogeneous magnetic field B in a measuring volume, the magnet arrangement further comprising at least one second rotationally symmetric permanent magnet element, which is arranged in a radial region $R<R_i$ and with respect to the plane E on the same side as the permanent magnet ring and at an axial distance from the plane E, whereby a depression V is formed on the surface of the magnet arrangement facing plane E, and that the permanent magnet element generates at least 90% of the homogeneous magnetic field B in the measuring volume.

2. Magnet arrangement according to claim 1, characterized in that its radial outer surface is cylindrical with outer radius $R_a$ and extends axially to the plane E.

3. Magnet arrangement according to claim 1, characterized in that the shape of the recess V is cylindrical with a cylinder axis z, with an essentially planar bottom and a cylindrical outer delimitation of inner radius $R_i$ and with an axial length T.

4. Magnet arrangement according to claim 1, characterized in that rotationally symmetric structures are included in a largely planar bottom of depression V.

5. Magnet arrangement according claim 4, characterized in that rotationally symmetric structures are included in the rear side of the magnet arrangement facing away from plane E.

6. Magnet arrangement according to claim 1, characterized in that it comprises several stacked permanent magnetic cylindrical rings which are mechanically connected to one another.

7. Magnet arrangement according to claim 6, characterized in that it comprises a solid permanent magnetic cylinder on the z-axis.

8. Magnet arrangement according to claim 3, characterized in that the ratio $T/R_i$ of the axial length T of the depression V and the inner radius $R_i$ is between 0.2 and 0.8.

9. Magnet arrangement according to claim 8, characterized in that the outer radius is $R_a \leq 0.4$ m, preferentially $R_a < 0.1$ m.

10. Magnet arrangement according to claim 1, characterized in that the magnetic field strength generated by the magnet arrangement is between 0.05 T and 0.3 T.

11. Magnet arrangement according to claim 1, characterized in that the measuring volume is located in the axial direction at least partially, on the side of the plane E facing away from the magnet arrangement.

12. Magnet arrangement according to claim 1, characterized in that a magnetic mirror plate of soft magnetic material is provided on the side of the magnet arrangement facing away from the plane E.

13. Magnet arrangement according to claim 1, characterized in that, on its rear side or on the bottom of depression V, at least one disc-shaped, preferentially removable supporting plate is mounted, on which small additional magnets can be mounted for shimming of the magnetic field B.

14. Magnet arrangement according to claim 1, characterized in that the field-generating elements contain a permanent magnetic material with high magnetic hardness, the magnetization M(H) of which, in the magnetized state when applying a magnetic demagnetizing field H up to a strength at which the magnetic inductance B in the magnetic material disappears, is reduced by less than 20% with respect its the remanent magnetization Mr.

15. Magnet arrangement according to claim 1, characterized in that its surface is surrounded at least partially, by a first layer of sheet metal having a good thermal conductivity and, at a short distance therefrom, is surrounded by a second layer consisting at least partially of metal, wherein the second layer is connected to the first layer by means of one or more spacers having a poor thermal conductivity, and wherein the temperature of the second layer is stabilized.

16. Magnet arrangement according to claim 15, characterized in that the space between the first and second layers contains super-insulating material and is otherwise evacuated.

17. Magnet arrangement according to claim 1, characterized in that in the depression V a gradient coil system is located, which is also limited to a half space delimited by the plane E.

18. Magnet arrangement according to claim 17, characterized in that an essentially planar surface-rf coil, which generates in the region of the measuring volume a magnetic rf field directed perpendicularly to the z-axis, is arranged on the surface of the gradient coil system.

19. Magnet arrangement according to claim 17, characterized in that the gradient coil system has three partial coils for the generation of three magnetic field gradients $dB_z/dz$, $dB_z/dx$, $dB_z/dy$ in the direction of the z-axis and in two spatial directions x and y, which are orthogonal thereto, within the measuring volume, wherein the magnetic field gradients can be set by selection of currents in the partial coils and wherein the gradient coil system is located entirely on the side of the measuring volume facing the magnet arrangement.

20. Magnet arrangement according to claim 19, characterized in that all partial coils contain active shielding coils which largely reduce the stray field of each partial coil in the region of the magnetic material of the magnet arrangement.

21. Magnet arrangement according to claim 20, characterized in that the windings of each shielding coil are each located in a plane perpendicular to the z-axis.

22. Magnet arrangement according to claim 21, characterized in that these planes are arranged as closely as possible to the bottom of depression V or of a depression V' of a thermal shielding.

23. Magnet arrangement according to claim 20, characterized in that the windings or winding sections of each shielding coil are each arranged partially in a plane perpendicular to the z-axis, and partially on the surface of a cylinder delimiting said plane radially from the outside, wherein these planes are arranged as closely as possible to the bottom of depression V and a depression V' of a thermal shielding and the cylindrical surface is arranged as closely as possible to the surface of the delimitation of depression V or depression V'.

24. Magnet arrangement according to claim 20, characterized in that the windings of each partial coil which are not located in the shielding coils, are each located in one plane.

25. Magnet arrangement according to claim 20, characterized in that the windings of the partial coils which are not located in the shielding coils are arranged in an area which comprises at a small radial distance from the z-axis a depression V".

26. Magnet arrangement according to claim 1 further comprising a cylindrical radial outer surface with an outer radius $R_a$ which extends axially to the plane E, a largely planar bottom of depression V including rotationally symmetric structures, several stacked permanent magnetic cylindrical rings which are mechanically connected to each other, a solid permanent magnetic cylinder on the z-axis, regulating means for regulating the surrounding temperature of the magnet arrangement, a shielded gradient coil system, comprising three partial coils for the generation of three magnetic field gradients $dB_z/dz$, $dB_z/dx$, $dB_z/dy$ in the direction of the z-axis and in two spatial directions x and y, which are orthogonal thereto, within the measuring volume, wherein the magnetic field gradients can be set by selection of currents in the partial coils and wherein the gradient coil system is located entirely on the side of the measuring volume facing the magnet arrangement, an essentially planar surface rf coil on the surface of the shielded gradient coil system, which generates in the region of the measuring volume a magnetic rf field directed perpendicularly to the z-axis.

27. Magnet arrangement according to claim 26, wherein the ratio of outer and inner cylinder radii is between 1.2 and 4.0, the ratio $T/R_i$ is between 0.2 and 0.8, the outer radius is $R_a < 0.1$ m, its generated magnetic field strength is between 0.05 T and 0.3 T, on its rear side or on the bottom of depression V, at least one disc-shaped, removable support plate is mounted, on which small additional magnets can be mounted for shimming of the magnetic field B, the field-generating elements contain a permanent magnetic material with high magnetic hardness, the magnetization M(H) of which, in the magnetized state when applying a magnetic demagnetizing field H up to a strength at which the magnetic inductance B in the magnetic material disappears, is reduced by less than 20% with respect to its remanent magnetization $M_r$, its surface is surrounded at least partially, by a first layer of sheet metal having a good thermal conductivity and, at a short distance therefrom, is surrounded by a second layer consisting at least partially of metal, wherein the second layer is connected to the first layer by means of one or more spacers having a poor thermal conductivity, and wherein the temperature of the second layer is stabilized, and the space between the first and second layers contains super-insulating material and is otherwise evacuated.

28. Gradient coil system for a one-sided NMR tomography system having a magnet arrangement, comprising three partial coils for the generation of three magnetic field gradients $dB_z/dz$, $dB_z/dx$, $dB_z/dy$ along the z-axis of the magnet arrangement and in two spatial directions x and y orthogonal thereto within a measuring volume of the tomography system, wherein the magnetic field gradients can be set by selection of partial coil currents, as well as three shielding coils which are each associated to one of the three partial coils, wherein the windings of the partial coils and of the shielding coils are located on cone-shaped surfaces having cone opening angles of between 150° and 180°.

* * * * *